US010295916B2

(12) United States Patent
Mulder et al.

(10) Patent No.: US 10,295,916 B2
(45) Date of Patent: May 21, 2019

(54) EUV SOURCE CHAMBER AND GAS FLOW REGIME FOR LITHOGRAPHIC APPARATUS, MULTI-LAYER MIRROR AND LITHOGRAPHIC APPARATUS

(71) Applicant: ASML NETHERLANDS B.V., Veldhoven (NL)

(72) Inventors: Heine Melle Mulder, Veldhoven (NL); Andrey Sergeevich Tychkov, Eindhoven (NL); Willem Van Schaik, 's Hertogenbosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/961,399

(22) Filed: Apr. 24, 2018

(65) Prior Publication Data

US 2018/0246422 A1 Aug. 30, 2018

Related U.S. Application Data

(63) Continuation of application No. PCT/EP2016/076287, filed on Nov. 1, 2016.

(30) Foreign Application Priority Data

Nov. 19, 2015 (EP) .................................. 15195362
Dec. 14, 2015 (EP) .................................. 15199803

(51) Int. Cl.
*G03F 7/20* (2006.01)
*G21K 1/06* (2006.01)
*H05G 2/00* (2006.01)

(52) U.S. Cl.
CPC ...... *G03F 7/70916* (2013.01); *G03F 7/70033* (2013.01); *G03F 7/70933* (2013.01); *G03F 7/70983* (2013.01); *G21K 1/062* (2013.01); *H05G 2/008* (2013.01)

(58) Field of Classification Search
CPC ............. G03F 7/70033; G03F 7/70916; G03F 7/70933; G03F 7/70983; G21K 1/062; H05G 2/008
See application file for complete search history.

(56) References Cited

U.S. PATENT DOCUMENTS

| | | | | |
|---|---|---|---|---|
| 5,581,605 A * | 12/1996 | Murakami | ............. | B82Y 10/00 359/619 |
| 6,064,072 A | 5/2000 | Partlo et al. | | |
| 7,101,645 B1 * | 9/2006 | La Fontaine | .......... | B82Y 10/00 378/35 |
| 2005/0111080 A1 * | 5/2005 | Bakker | ................. | B82Y 10/00 359/350 |

(Continued)

OTHER PUBLICATIONS

"Research Disclosure" Mason Publications, Hampshire GB, vol. 609, No. 10 Jan. 1, 2015 p. 5.

*Primary Examiner* — Wyatt A Stoffa
(74) *Attorney, Agent, or Firm* — Arent Fox LLP

(57) ABSTRACT

Disclosed is a radiation source module and a radiation collector for the module with the radiation collector comprising a substrate coated with at least one reflective layer and a plurality of perforations within the reflective layer, with the plurality of holes forming vertices of a grid substantially covering the surface, and wherein the coating may comprise multiple layers.

20 Claims, 4 Drawing Sheets

(56) References Cited

U.S. PATENT DOCUMENTS

| | | | |
|---|---|---|---|
| 2006/0160031 A1* | 7/2006 | Wurm | G02B 5/208 430/322 |
| 2008/0179548 A1 | 7/2008 | Bykanov et al. | |
| 2009/0250639 A1 | 10/2009 | Banine et al. | |
| 2010/0328774 A1* | 12/2010 | Hong | G01N 21/7743 359/568 |
| 2011/0262699 A1* | 10/2011 | Yializis | B32B 15/08 428/138 |
| 2012/0025109 A1 | 2/2012 | Abhari et al. | |
| 2012/0305810 A1* | 12/2012 | Ershov | G03F 7/70033 250/504 R |
| 2012/0327381 A1 | 12/2012 | Labetski et al. | |
| 2013/0188245 A1* | 7/2013 | Jaiswal | G02B 5/208 359/350 |
| 2015/0077729 A1 | 3/2015 | Van Empel et al. | |
| 2015/0212427 A1* | 7/2015 | Li | G03F 7/70958 359/359 |
| 2015/0229032 A1* | 8/2015 | Liu | H01Q 15/23 343/766 |
| 2015/0338753 A1* | 11/2015 | Riepen | G03F 7/70033 250/504 R |
| 2016/0085003 A1* | 3/2016 | Jaiswal | G02B 5/208 850/33 |

* cited by examiner

EUV SOURCE CHAMBER AND GAS FLOW REGIME FOR LITHOGRAPHIC APPARATUS, MULTI-LAYER MIRROR AND LITHOGRAPHIC APPARATUS

CROSS-REFERENCE TO RELATED APPLICATIONS

The present application is a continuation of International application No. PCT/EP2016/076287, filed Nov. 1, 2016 which claims priority of EP application 15195362.7 which was filed on 19 Nov. 2015 and EP application 15199803.6 which was filed on 14 Dec. 2015 the entire contents of each of which are incorporated herein by reference.

FIELD

The present invention relates to a lithographic apparatus and specifically to an EUV source chamber within a lithographic apparatus, and to a multi-layer mirror usable in such a source chamber.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

To protect the source collector from being contaminated with fuel debris particles which are emitted from the plasma formation site, it is known to establish a gas flow regime within the source chamber. The gas flow regime establishes a gas flow away from the source collector and towards an outlet, thereby transporting the debris away from the collector and out through the outlet.

SUMMARY

It would be desirable to provide an improved gas flow regime within the source chamber. It would also be desirable to mitigate the formation of blisters on a collector surface.

The invention in a first aspect provides a radiation source module operable to generate a radiation producing plasma at a plasma formation site by excitation of a fuel, said radiation source comprising: a source chamber; a radiation collector within the source chamber for collecting and focusing said radiation; a primary buffer gas inlet for admitting a primary buffer gas into the source chamber; and a buffer gas outlet in the vicinity of said radiation collector, for exhausting said primary buffer gas from the source chamber.

The invention in a second aspect provides method of transporting fuel debris out of a source chamber of a radiation source during generation of radiation by excitation of fuel to generate a plasma at a plasma formation site, said method comprising: admitting a primary buffer gas into the source chamber; and exhausting said primary buffer gas from the source chamber in the vicinity of a radiation collector within the source chamber, said radiation collector being for collecting and focusing said radiation, thereby generating a primary buffer gas flow within said source chamber, said primary buffer gas flow transporting said fuel debris out of the source chamber.

The invention in a third aspect provides a multi-layer mirror comprising a substrate coated with at least one reflective layer, said at least one reflective layer comprising a plurality of perforations.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which.

Figure 3:
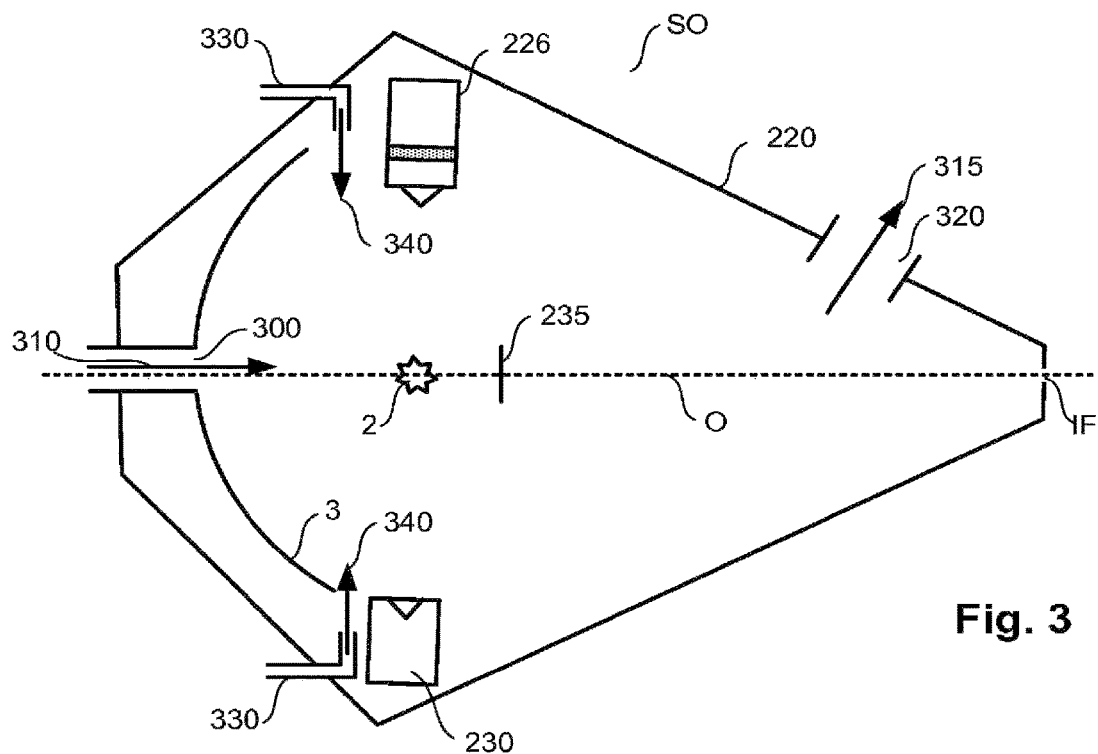
Figure 4:
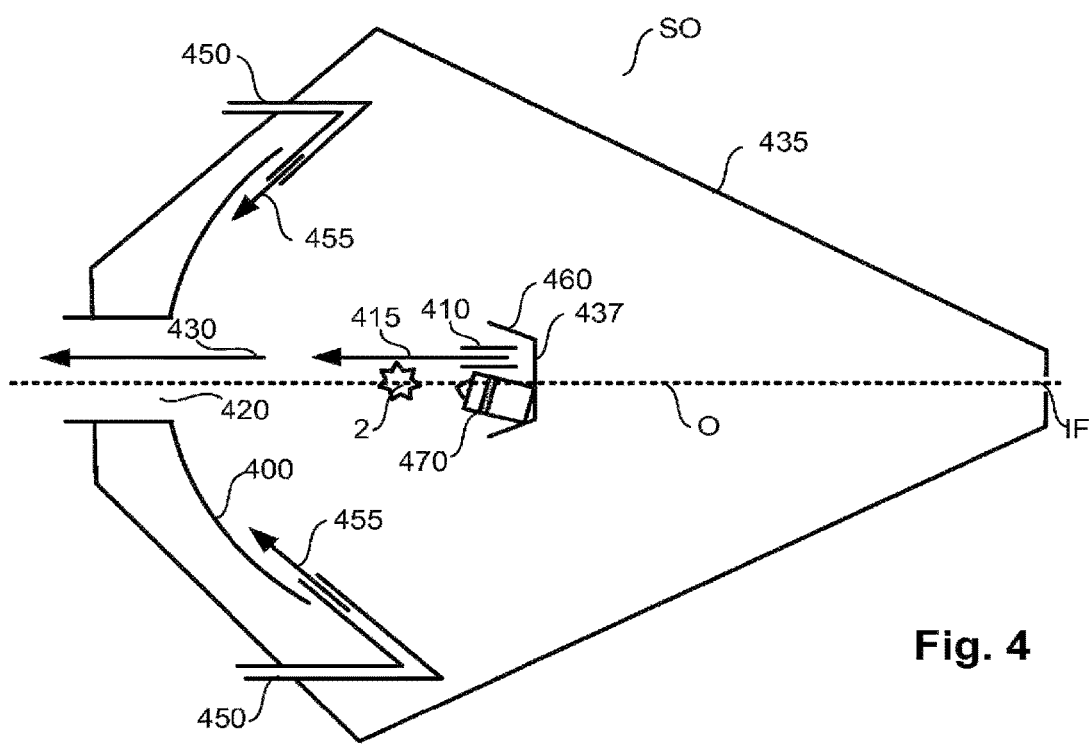
Figure 5:
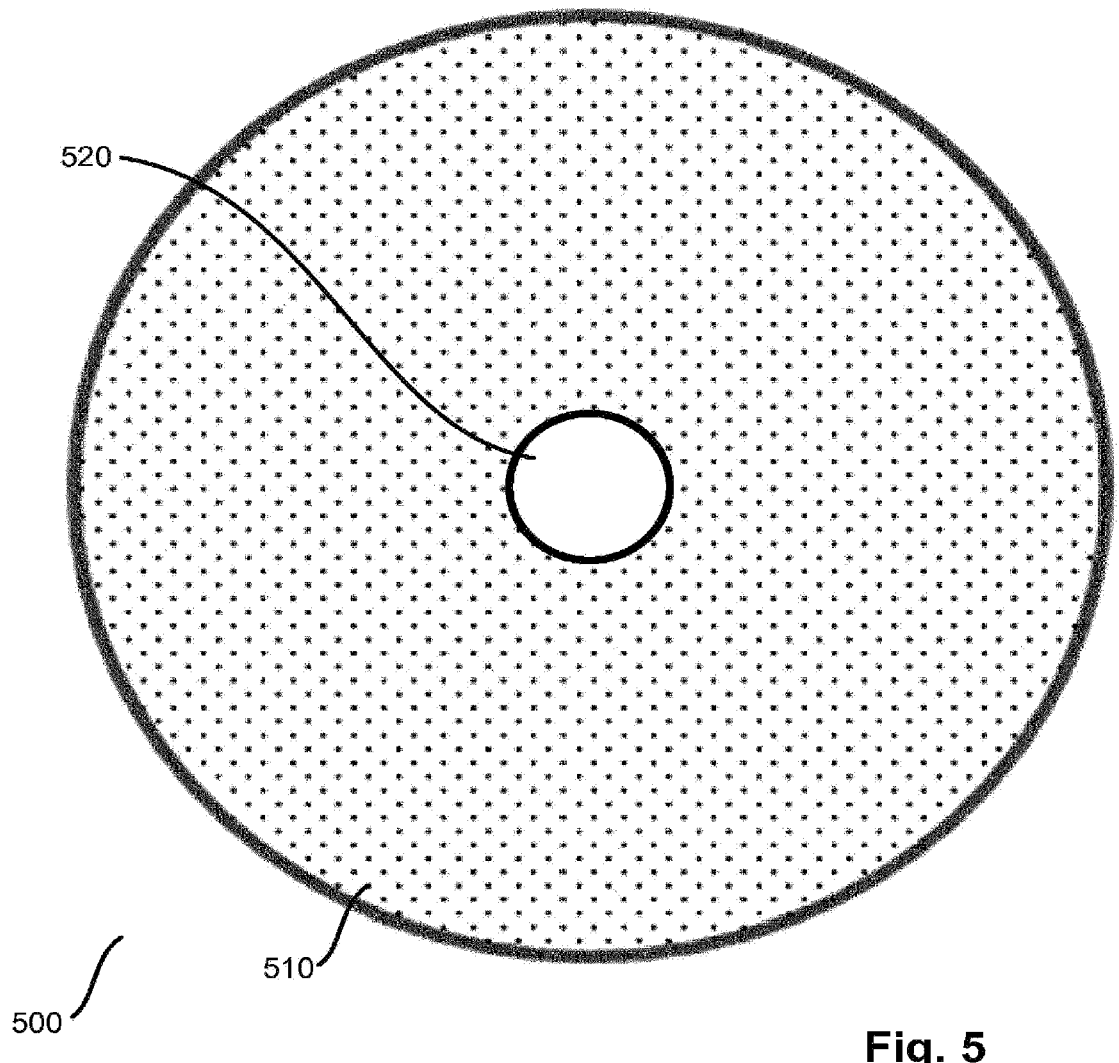
Figure 6:
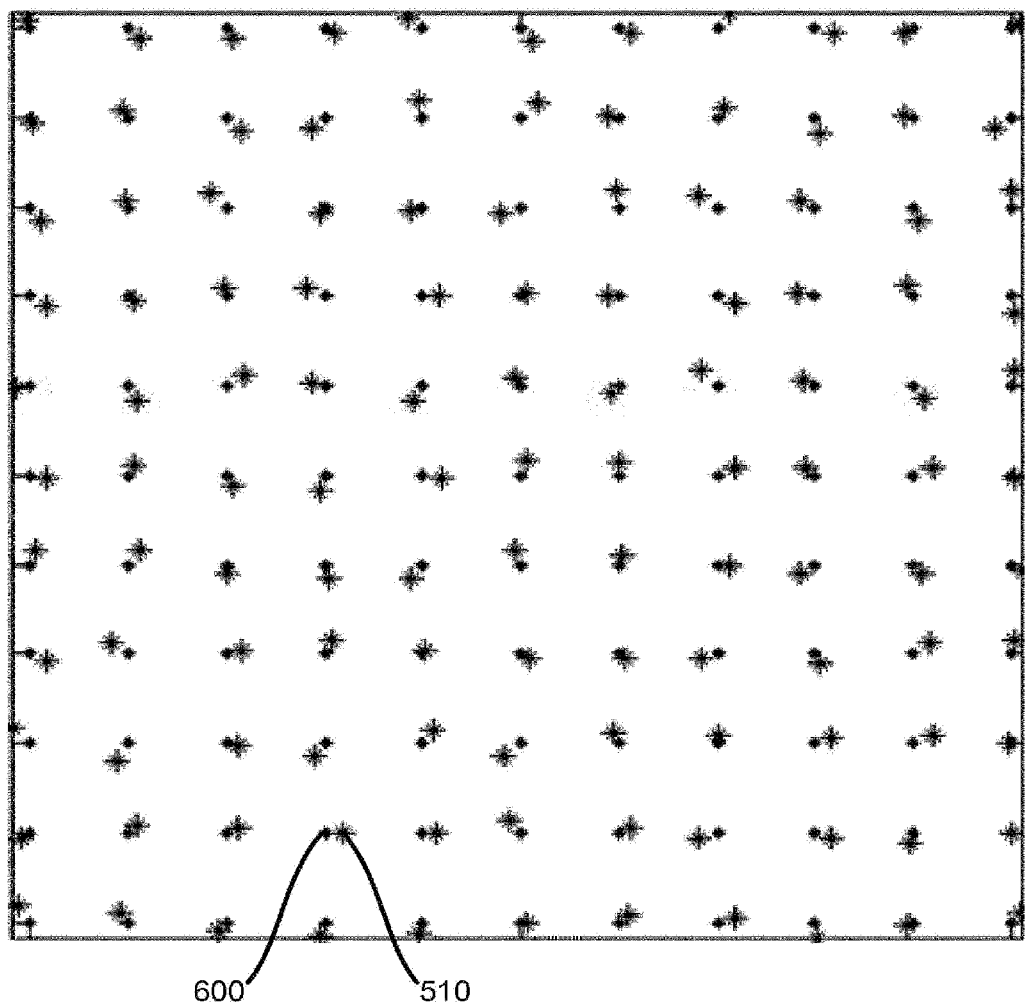

FIG. 3 schematically depicts a source module with buffer gas flow regime illustrated;

FIG. 4 schematically depicts a source module according to an embodiment of the invention with buffer gas flow regime illustrated;

FIG. 5 schematically illustrates a radiation collector according to an embodiment of the invention; and FIG. 6 schematically illustrates a grid arrangement for perforations on a radiation collector according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

Figure 1:
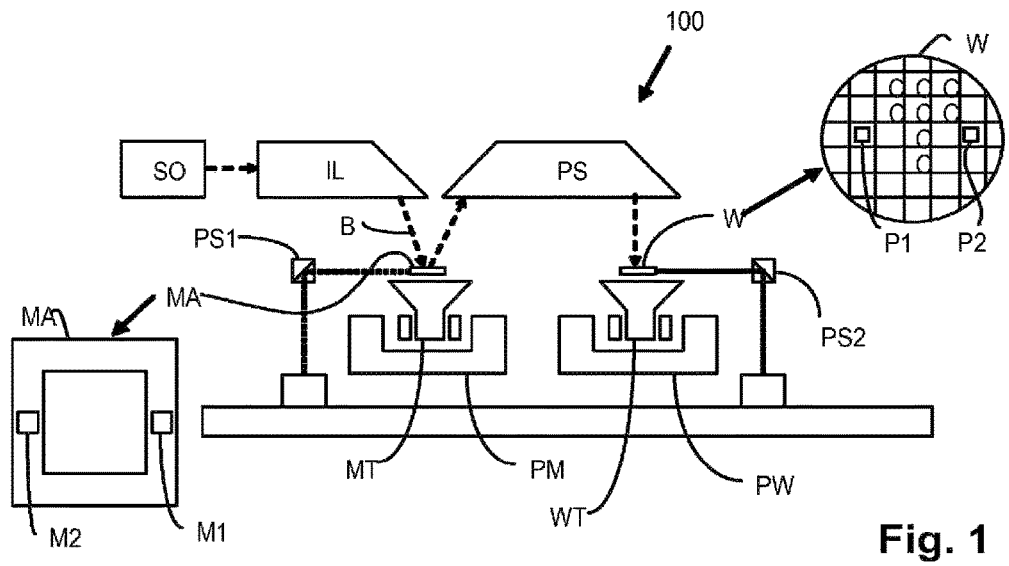
FIG. 1 depicts schematically a lithographic apparatus having reflective projection optics.

FIG. 1 schematically depicts a lithographic apparatus 100 including a source collector module SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

Figure 2:
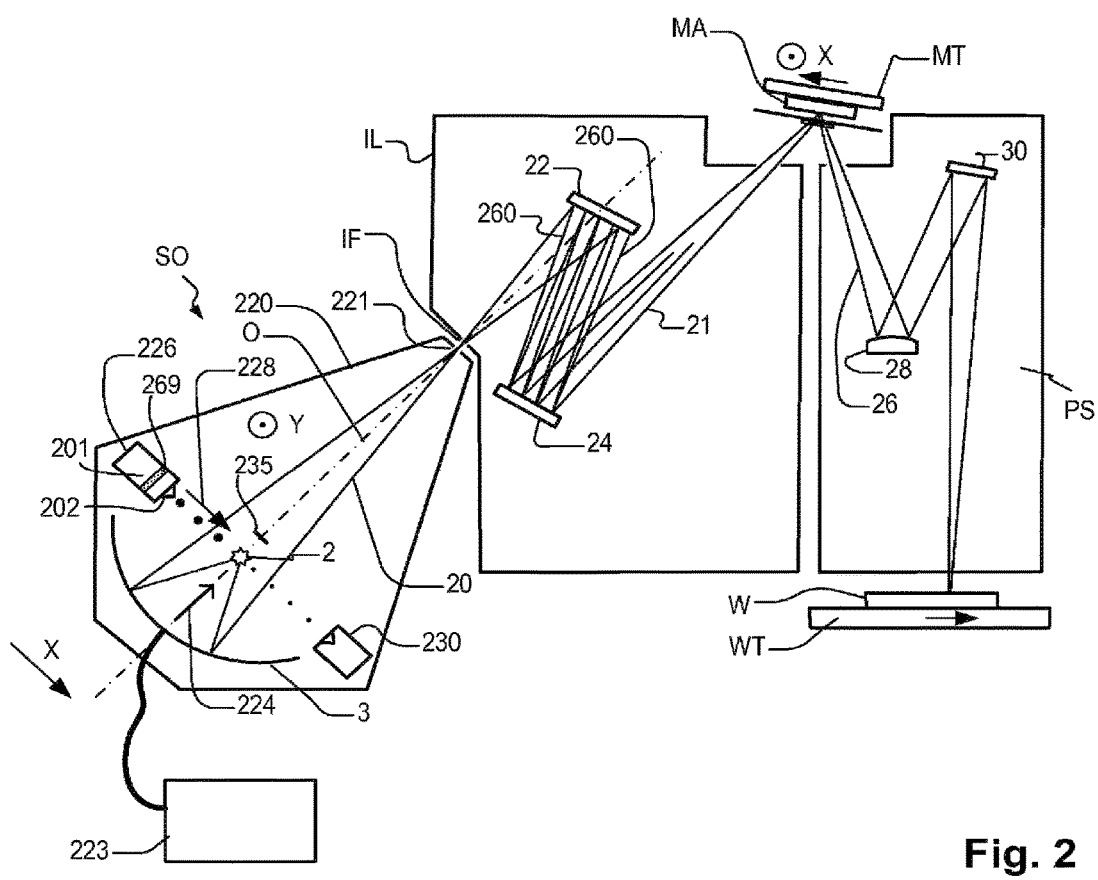
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure or source chamber 220 of the source collector module SO. The systems IL and PS are likewise contained within vacuum environments of their own. An EUV radiation emitting plasma 2 may be formed by a laser produced LPP plasma source. The function of source collector module SO is to deliver EUV radiation beam 20 from the plasma 2 such that it is focused in a virtual source point. The virtual source point is commonly referred to as the intermediate focus (IF), and the source collector module is arranged such that the intermediate focus IF is located at or near an aperture 221 in the source chamber 220. The virtual source point IF is an image of the radiation emitting plasma 2.

From the aperture 221 at the intermediate focus IF, the radiation traverses the illumination system IL, which in this example includes a facetted field mirror device 22 and a facetted pupil mirror device 24. These devices form a so-called "fly's eye" illuminator, which is arranged to provide a desired angular distribution of the radiation beam 21, at the patterning device MA, as well as a desired uniformity of radiation intensity at the patterning device MA. Upon reflection of the beam 21 at the patterning device MA, held by the support structure (mask table) MT, a patterned beam 26 is formed and the patterned beam 26 is imaged by the projection system PS via reflective elements 28, 30 onto a substrate W held by the wafer stage or substrate table WT. To expose a target portion C on substrate W, pulses of radiation are generated on substrate table WT and masked table MT perform synchronized movements 266, 268 to scan the pattern on patterning device MA through the slit of illumination.

Each system IL and PS is arranged within its own vacuum or near-vacuum environment, defined by enclosing structures similar to source chamber 220. More elements than shown may generally be present in illumination system IL and projection system PS. Further, there may be more mirrors present than those shown in the Figures. For example there may be one to six additional reflective elements present in the illumination system IL and/or the projection system PS, besides those shown in FIG. 2.

Considering source collector module SO in more detail, laser energy source comprising laser 223 is arranged to deposit laser energy 224 into a fuel, such as xenon (Xe), tin (Sn) or lithium (Li), creating the highly ionized plasma 2 with electron temperatures of several 10's of eV. Higher energy EUV radiation may be generated with other fuel materials, for example Tb and Gd. The energetic radiation generated during de-excitation and recombination of these ions is emitted from the plasma, collected by a near-normal incidence collector 3 and focused on the aperture 221. The plasma 2 and the aperture 221 are located at first and second focal points of collector CO, respectively.

Although the collector 3 shown in FIG. 2 is a single curved mirror, the collector may take other forms. For example, the collector may be a Schwarzschild collector having two radiation collecting surfaces. In an embodiment, the collector may be a grazing incidence collector which comprises a plurality of substantially cylindrical reflectors nested within one another.

To deliver the fuel, which for example is liquid tin, a droplet generator 226 is arranged within the source chamber 220, arranged to fire a high frequency stream 228 of droplets towards the desired location of plasma 2. In operation, laser energy 224 is delivered in a synchronism with the operation of droplet generator 226, to deliver impulses of radiation to turn each fuel droplet into a plasma 2. The frequency of delivery of droplets may be several kilohertz, for example 50 kHz. In practice, laser energy 224 is delivered in at least two pulses: a pre pulse with limited energy is delivered to the droplet before it reaches the plasma location, in order to vaporize the fuel material into a small cloud, and then a main pulse of laser energy 224 is delivered to the cloud at the desired location, to generate the plasma 2. A trap 230 is provided on the opposite side of the source chamber 220, to capture fuel that is not, for whatever reason, turned into plasma. Obscuration 235 acts to prevent laser radiation from passing through the intermediate focus IF, where it may result in undesirable heating and/or damage to mirrors and other optical components within illumination system IL and projection system PS. Optical components for focusing laser radiation on said plasma generation site may be separated from the plasma generation site by for example a distance of half a meter or more.

As the skilled reader will know, reference axes X, Y and Z may be defined for measuring and describing the geometry and behavior of the apparatus, its various components, and the radiation beams 20, 21, 26. At each part of the apparatus, a local reference frame of X, Y and Z axes may be defined. The Z axis broadly coincides with the direction optical axis O at a given point in the system, and is generally normal to the plane of a patterning device (reticle) MA and normal to the plane of substrate W. In the source collector module, the X axis coincides broadly with the direction of fuel stream 228, while the Y axis is orthogonal to that, pointing out of the page as indicated in FIG. 2. On the other hand, in the vicinity of the support structure MT that holds the reticle MA, the X axis is generally transverse to a scanning direction aligned with the Y axis. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

Numerous additional components critical to operation of the source collector module and the lithographic apparatus as a whole are present in a typical apparatus, though not illustrated here. These include arrangements for reducing or mitigating the effects of contamination within the enclosed vacuum, for example to prevent deposits of fuel material damaging or impairing the performance of collector 3 and other optics. Other features present but not described in detail are all the sensors, controllers and actuators involved in controlling of the various components and sub-systems of the lithographic apparatus.

When a fuel droplet is excited by laser radiation, one undesirable side effect is that ionic and neutral fuel debris is produced. High energy ionic debris can damage the collector surface. Low energy ionic debris and neutral debris can deposit on the collector surface. Both of these effects lead to a reduction in collector reflection efficiency, and therefore a reduction in collector lifetime.

To mitigate the effect of the fuel debris on the collector, a protective buffer gas flow may be established within the source chamber in a direction away from the collector to an outlet a distance away from the collector. The gas flow, along with a buffer gas density established within the source chamber, acts to stop the fuel debris, thermalize the fuel debris, and transport the fuel debris away from the collector and out of the source chamber. The protective gas used may be hydrogen gas ($H_2$).

FIG. 3 schematically illustrates such a buffer gas flow regime within a source module SO such as that illustrated in FIG. 2. It shows the source chamber 220, collector 3, droplet generator 226, trap 230, plasma 2 obscuration 235 and intermediate focus IF as already described. Additionally there is shown an aperture 300 in the collector 3, which serves as a main buffer gas inlet through which a buffer gas flow 310, 315 is generated in the source chamber 220. The aperture 300 may also be the entry point through which laser radiation is introduced into the source chamber 220 to excite the fuel to produce plasma 2. This buffer gas flow 310, 315 transports any fuel debris away from the collector 3 and towards an outlet 320 located on a wall of the source chamber 220, which acts as an exhaust for the buffer gas flow 310, 315. In this way, the fuel debris is transported away from the collector 3 and out of the source chamber 220 through outlet 320. Additional buffer gas inlets 330 may be provided, referred to as peripheral gas inlets 330. This may provide additional gas flows 340 in a direction across the collector 3 surface, thereby acting as an additional barrier between the plasma 2 and collector 3.

There are a number of issues with the gas flow regime described above. A main issue is that the pressure generated by plasma 2 acts against the buffer gas flow 310 introduced through aperture 300. This plasma pressure is as a result of the momentum of the ions generated with the plasma 2 (ionic debris) in the direction of the collector 3. It can be demonstrated that the majority of the high energy ionic debris generated tend to be directed from plasma 2 towards the collector 3. Particularly, the ionic debris with the highest energy tends to be directed towards the collector 3 and aperture 300. This means that a very high buffer gas pressure is required to overcome this plasma pressure. Even with a very high buffer gas pressure, the plasma pressure can still cause the gas flow path towards outlet 320 to be disrupted. Another issue is that a significant amount of the fuel debris does not actually get transported through outlet 320, but rather is deposited on the source wall around or near the outlet 320. This fuel debris may coalesce and fall on the collector surface under the influence of gravity. Various containment mechanisms (e.g., vane structures) have been designed to attempt to overcome this, although none are completely effective at preventing collector 3 contamination in this manner.

Another issue relates to the stopping power of the buffer gas, particularly as EUV powers (and therefore ionic fuel debris powers) increase. This ionic fuel debris heats up the buffer gas between plasma 2 and collector 3, decreasing its density and consequently, its stopping power. Also, heat release from the plasma influences the designated gas flow pattern, decreasing collector 3 protection efficiency. Scaling such a buffer gas regime to high EUV powers becomes increasingly challenging due to the formation of hot buffer gas in the region between the plasma 2 and collector 3. This leads to either direct penetration of ionic fuel debris through the buffer gas and onto the collector, resulting in ion implantation or sputtering of the collector surface, or to stopping of the ionic fuel debris at a point very near to the collector, which also results in contamination of the collector surface.

FIG. 4 schematically illustrates a source module SO with an improved buffer gas flow regime compared to that of FIG. 3. The main difference is that the gas flow direction is generally reversed, toward the center of the collector 400. As such there is a main gas inlet 410 provided on the opposite side of the plasma 2 to the collector 400, introducing a buffer gas flow 415, 430 into the source chamber 435. The aperture 420 at the center of the collector 400 acts now as the buffer gas outlet (as before, laser radiation is introduced through this aperture 420 for exciting the fuel to generate plasma 2). As such, there is a primary buffer gas flow 415, 430 out of the source chamber 435 through the aperture 420 at the collector center.

In an embodiment, this main gas inlet 410 may be located within the shadow of obscuration 437. In this way, the main gas inlet 410 will not interfere with the generated EUV radiation. The main gas inlet 410 may be at or near the optical axis O of the source module SO. The resultant gas flow regime means that the buffer gas flow 415, 430 no longer acts against the plasma pressure, but instead is actually pumped (i.e pushed) by the plasma pressure, thereby enhancing the gas flow towards the center of the collector 400. The primary buffer gas inlet and the buffer gas outlet are preferably located such that the primary buffer gas flow is pushed by the plasma pressure towards the radiation collector.

This means that a smaller gas pressure at the main gas inlet 410 is necessary. Additionally, the fuel debris is now largely contained within a volume between the aperture 420 and plasma 2. As such, very little of the fuel debris will contact the walls of the source chamber 440, or enter the source chamber 440 volume between the plasma 2 and the intermediate focus IF. This means that there is little or no need for the containment structures on the source chamber 440 walls. A desirable consequence of this is that the source module SO can be orientated vertically, with the collector towards the bottom. This is not possible at present, as such an orientation prevents the containment structures from containing the fuel debris collected at the source chamber 440 walls, which would therefore fall on and contaminate the collector 400 surface.

To prevent contamination of the collector surface, it may be that aperture 420 may need to be larger than the aperture 300 of the FIG. 3 arrangement. While this will result in loss of EUV radiation compared to a smaller aperture, this can be offset by the other advantages such an arrangement offers.

Another significant advantage of the arrangement shown is that it enables a heavier gas, such as Argon, to be used in the buffer gas, and in particular in greater proportions and/or greater densities than has been used before. Argon has additional particle stopping power compared to hydrogen, and is also cheaper. Additionally a hydrogen/argon gas mixture is safer to handle than pure hydrogen. The arrangement shown results in there being very little buffer gas in the source volume between the plasma 2 and intermediate focus IF, while previously a buffer gas outlet would be located in this region. As argon will absorb EUV radiation, its presence in the source volume should be kept to a minimum. To further confine the buffer gas within the vicinity of the collector 400, there may be provided peripheral gas inlets 450, through which peripheral gas flows 455 are introduced. If the peripheral flow comprises argon, there will be argon between the plasma and collector, and therefore in the EUV radiation path. However, the small volume in which the buffer gas is mainly confined (compared to the FIG. 3 arrangement) means that the resultant EUV absorption occurs only over a short distance relative to the distance between the plasma 2 and intermediate focus IF (e.g., about only 10% of the EUV radiation path distance). Therefore the overall effect on EUV output is minimal. Alternatively, in another embodiment, the buffer gas of peripheral flows 455 comprise only a gas transparent to EUV radiation (e.g., only hydrogen), and any heavier gas comprised within the buffer gas is confined to only the primary buffer gas flow 415, 430. In another alternative, both the primary gas flow 415, 430 and peripheral gas flow 455 include the heavier gas, but the peripheral gas flow 455 includes the heavier gas in smaller proportion compared to the primary gas flow 415, 430.

As before, the aperture 420 may be the aperture through which laser radiation is admitted for exciting the fuel to produce plasma. It can be shown that the buffer gas does not absorb the laser radiation and consequently an increase in buffer gas density and/or the use of buffer gasses other than hydrogen will not adversely affect transmission of the laser radiation to the fuel. In fact, an advantage of this is that the stopping distance for ionic fuel debris can be made very large compared to current designs. Presently, such ionic fuel debris needs to be stopped within the source chamber, before being transported through the outlet (e.g., outlet 320). In the FIG. 4 arrangement, there may be a large distance (e.g., over 0.5 m or in the region of 1 m) between the laser optics and the plasma, providing a large distance over which very high energy ionic fuel debris (e.g., >50 keV) can be stopped. As such, the ionic fuel debris no longer needs to be stopped within the source chamber 435, but can be stopped after it has left the source chamber 435 through aperture 420.

Additionally, sputtering of the walls along this stopping distance should not present a problem and may be allowed provided that the ionic fuel debris is prevented from damaging the focus optics of the laser. As such, the buffer gas flow (and/or other elements) should prevent any sputtering product from entering parts of the system comprising mirrors (e.g., the laser beam delivery system). Ionic fuel debris directed into the aperture 420 can be allowed to hit the inlet walls, thus significantly reducing its momentum. As the buffer gas flow illustrated in FIG. 4 prevents all but a minimal amount of sputtering product from entering the source chamber volume behind the plasma (towards the intermediate focus IF), sputtering of the source chamber walls in this region is essentially prevented. Such sputtering can result in the release of other contaminants within the source chamber.

With the proposed arrangement, it can be demonstrated that high velocity ionic fuel debris is confined to a region within a +/−30 degree angle from the laser axis towards the collector 400. By making the aperture 420 sufficiently large, as described, this region may be such that high velocity ionic fuel debris is confined within a substantially cylindrical volume between the main gas inlet and aperture 420, having a diameter defined by the diameter of the aperture 420. Low velocity ionic fuel debris and neutral fuel debris are primarily directed away from collector 400, towards the main gas inlet 410. In an embodiment a heated fuel catcher 460 may be provided at the main gas inlet 410, to catch this low velocity ionic fuel debris and neutral fuel debris. The heated fuel catcher may be maintained at a temperature sufficient to vaporize the fuel, allowing it to be transported by the gas flow 415, 430 out of aperture 420. Alternatively, or additionally, the center walls of main gas inlet 410 can also be heated such that any fuel debris adheres to these center walls. This may eliminate the need for any additional confinement (e.g. vanes) assembly.

Any (hydrogen) buffer gas that is between the plasma 2 and intermediate focus IF is not heated by high energy ionic fuel debris, as this high energy ionic fuel debris largely remains confined between the plasma 2 and collector 400. This result in any EUV transmission transients at the beginning of each burst being reduced.

In an embodiment, main gas inlet 410 and/or peripheral gas inlet 450 may emit the buffer gas supersonically. In an embodiment, the inlets 410, 450 may comprise supersonic injectors emitting an annular buffer gas profile.

The proposed arrangement means that the droplet trajectory may be made intrinsically more stable. In an embodiment, the fuel droplets may be supplied from within the region of the main gas inlet 410, with the main buffer gas flow 415. Hence, the path of the droplets can be almost parallel the path of the buffer gas flow (e.g., the paths defining an angle smaller than 30 degrees, smaller than 20 degrees or smaller than 10 degrees) reducing the effect of the drag force. This is illustrated in FIG. 4, where droplet generator 470 is shown in the vicinity of the main gas inlet 410.

Radiation collectors, such as collector 3 or collector 400 in the above description, comprise a substrate material coated with a reflective coating (one or more layers of material), e.g., a coating optimized for reflection of EUV radiation. However, the collector is known to suffer from blistering of the reflective coating. This blistering may be caused (at least in part) by the buffer gas, particularly hydrogen. It is understood that, due to their small size, the hydrogen atoms can diffuse several layers deep into a collector coating. Once atomic hydrogen invades the body of the collector it can bond to the substrate, get trapped at layer boundaries and interfaces, or both. This may be particularly the case where there are defects in the substrate structure. The magnitude of these effects depends on the dose and concentration of hydrogen in these regions. If the hydrogen concentration is above a certain threshold it can form bubbles of gaseous hydrogen compounds, either recombining to $H_2$ molecules or perhaps also forming $SiH_4$. When a gas bubble starts to form there is a high probability that it will grow in the presence of additional hydrogen. If such bubbles do form then their internal gas pressure will deform the layer above the bubble, leading to the formation of blisters (bulges) on the coating which grow over time.

A blistered coating creates several problems. The blisters will tend to scatter the EUV radiation rather than collecting it by reflecting it to the intermediate focus. A blistered coating also has a higher surface area and is more prone to degradation by oxidation and other contaminants and by deposition of target material. Due to higher absorption this generally leads to a reduction of EUV reflectance.

To repair a collector that has been affected by blistering, the blisters may be punctured following their detection. This may be done by drilling the blister (e.g., with a 0.1 mm diameter hole, 300 µm deep) using a specific tool. Doing this drilling in the field presents particular challenges and a suitable tool would have to be developed.

FIG. 5 schematically illustrates a radiation collector 500 according to an embodiment, which aims to mitigate the blistering issue. The radiation collector 500 has a central aperture 510 (as described), and further comprises a plurality of pre-drilled holes or perforations 510 within its coating layer. The spacing between perforations 510 may be less than 50 mm, less than 30 mm, less than 20 mm, less than 15 mm or less than 10 mm for example. In a specific example, this spacing may be in the region of 10 mm. The diameter of perforations 510 may be between 0.05 mm and 0.2 mm for example, and by way of specific example, may be in the region of 0.1 mm.

The perforations 510 act to prevent the formation of and/or to deflate any blisters without the need for positive intervention (drilling the blister). A blister will not form over a perforation 510, and blisters which form between perforations will expand until eventually a perforation 510 is encountered, deflating the blister. This limits the maximum size of any blister to that of the perforation spacing distance. The cost in terms of reflective area loss is so small such that it can be considered negligible. Using the example of 10 mm perforation spacing and 0.1 mm diameter perforations, area loss will be in the region of 0.08%.

The term "hole" or "perforation" should not be understood to imply that the collector is drilled through the whole substrate thickness. The drilling depth need be sufficient only to perforate one or more of the layers which make up the reflective coating. For example, the perforation 510 depth may be between 100 µm and 500 µm, between 200 µm and 400 µm or approximately 300 µm.

The perforations 510 in FIG. 5 are shown regularly spaced, forming a regular 2D grid. However, it may be desirable to break periodicity, thereby preventing any unintentional addition of a small uniformity disturbance in subsequent homogenization optics within the system. Also, by breaking periodicity, frequency beating and interference effects can be prevented. Therefore, it is proposed that a variable (e.g., random or pseudo-random) perturbation is added to the array of perforations 510. The variable perturbation may be such that the perforations are arranged with reference to a substantially regular grid pattern (in X and Y, with reference to the axes of source SO of FIG. 2—that is in a plane perpendicular with the optical axis O), but where each perforation is variably (e.g., randomly or pseudo-randomly) spaced (in X and Y) from its corresponding position on the regular pattern. The arrangement may be such that this variable spacing is constrained to be within $1/10^{th}$ of the regular grid spacing. In such an embodiment, the grid spacing examples given above may refer to grid spacing of the reference grid or the average spacing of the perforation array.

FIG. 6 illustrates such an arrangement. It shows the regular grid positions 600 (points) and the perforations 510 (stars). Perforations 510 are each a random distance (within a limit) away from its corresponding regular grid position 600.

While the above principle is described in terms of an EUV radiation collector, it can be applied to any multi-layer mirror subject to a similar environment and therefore where such blistering may be a problem. The radiation collector of this embodiment may be employed as the collector of any of the other embodiments described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation source module operable to generate a plasma that produces EUV radiation at a plasma formation site by excitation of a fuel, the radiation source module comprising a radiation collector for collecting and focusing the EUV radiation, the radiation collector comprising a coating configured to reflect the EUV radiation, the coating having a plurality of holes extending from a surface of the radiation collector into the coating, the plurality of holes forming vertices of a grid substantially covering the surface.

2. The radiation source module of claim 1, wherein a spacing between a pair of neighboring ones of the holes varies across the surface by at most 10% of an average of the spacing.

3. The radiation source module of claim 1, wherein each of the plurality of holes has a diameter between 0.05 mm and 0.2 mm.

4. The radiation source module of claim 2, wherein each of the plurality of holes has a diameter between 0.05 mm and 0.2 mm.

5. The radiation source module of claim 1, wherein a spacing between a pair of neighboring ones of the holes has a magnitude between less than 10 mm and 50 mm.

6. The radiation source module of claim 2, wherein a spacing between a pair of neighboring ones of the holes has a magnitude between less than 10 mm and 50 mm.

7. The radiation source module of claim 3, wherein a spacing between a pair of neighboring ones of the holes has a magnitude between less than 10 mm and 50 mm.

8. The radiation source module of claim 4, wherein a spacing between a pair of neighboring ones of the holes has a magnitude between less than 10 mm and 50 mm.

9. The radiation source module of claim 1, wherein each of the plurality of holes has a depth between 100 µm and 500 µm.

10. The radiation source module of claim 3, wherein each of the plurality of holes has a depth between 100 µm and 500 µm.

11. The radiation collector module of claim 1 wherein the coating comprises multiple layers.

12. A radiation collector for collecting and focusing EUV radiation, the radiation collector comprising a coating configured to reflect the EUV radiation, the coating having a plurality of holes extending from a surface of the radiation collector into the coating, the plurality of holes forming vertices of a grid substantially covering the surface.

13. The radiation collector of claim 12, wherein a spacing between a pair of neighboring ones of the holes varies across the surface by at most 10% of an average of the spacing.

14. The radiation collector of claim 12, wherein each of the plurality of holes has a diameter between 0.05 mm and 0.2 mm.

15. The radiation collector of claim 13, wherein each of the plurality of holes has a diameter between 0.05 mm and 0.2 mm.

16. A radiation collector for collecting and focusing EUV radiation, the radiation collector comprising a coating configured to reflect the radiation, the coating having a plurality of holes extending from a surface of the radiation collector into the coating, the plurality of holes forming vertices of a grid substantially covering the surface, wherein the coating comprises multiple layers.

17. The radiation collector of claim 16, wherein a spacing between a pair of neighboring ones of the holes varies across the surface by at most 10% of an average of the spacing.

18. The radiation collector of claim 16, wherein each of the plurality of holes has a diameter between 0.05 mm and 0.2 mm.

19. A lithographic system comprising:
a radiation source module operable to generate a plasma that produces EUV radiation at a plasma formation site by excitation of a fuel, the radiation source module comprising a radiation collector for collecting and focusing the EUV radiation, the radiation collector comprising a coating configured to reflect the EUV radiation, the coating having a plurality of holes extending from a surface of the radiation collector into the coating, the plurality of holes forming vertices of a grid substantially covering the surface; and
a lithographic apparatus operative to use the EUV radiation for imaging a pattern onto a substrate.

20. A lithographic system comprising:
a radiation source module operable to generate a plasma that produces EUV radiation at a plasma formation site by excitation of a fuel, the radiation source module comprising a radiation collector for collecting and focusing the EUV radiation, the radiation collector comprising a coating configured to reflect the radiation, the coating having a plurality of holes extending from a surface of the radiation collector into the coating, the plurality of holes forming vertices of a grid substantially covering the surface, wherein the coating comprises multiple layers; and
a lithographic apparatus operative to use the EUV radiation for imaging a pattern onto a substrate.

* * * * *